(12) United States Patent
Perner

(10) Patent No.: US 7,304,887 B2
(45) Date of Patent: Dec. 4, 2007

(54) METHOD AND APPARATUS FOR MULTI-PLANE MRAM

(75) Inventor: Frederick A. Perner, Santa Barbara, CA (US)

(73) Assignee: Samsung Electronics Co., Ltd. (KR)

( * ) Notice: Subject to any disclaimer, the term of this patent is extended or adjusted under 35 U.S.C. 154(b) by 185 days.

(21) Appl. No.: 10/934,243

(22) Filed: Sep. 3, 2004

(65) Prior Publication Data

US 2006/0050552 A1    Mar. 9, 2006

(51) Int. Cl.
  *G11C 11/14*    (2006.01)
(52) U.S. Cl. .................. 365/171; 365/158; 365/173
(58) Field of Classification Search ............. 365/158, 365/171, 173
  See application file for complete search history.

(56) References Cited

U.S. PATENT DOCUMENTS 6,473,336 B1 * 10/2002 Nakajima et al. ........... 365/171
6,788,605 B2 * 9/2004 Sharma et al. .............. 365/220
2006/0002182 A1 * 1/2006 Frey ........................... 365/158

* cited by examiner

*Primary Examiner*—Richard T. Elms
*Assistant Examiner*—Pho M. Luu
(74) *Attorney, Agent, or Firm*—Myers Bigel Sibley & Sajovec

(57) ABSTRACT

A memory device includes a first layer of MRAM memory cells arranged in accordance with an MRAM architecture, a second layer of MRAM memory cells that is fabricated over the first layer of MRAM memory cells, and a common connection associated with the first layer of MRAM memory cells and the second layer of MRAM memory cells that facilitates operation of the memory device. The method of fabricating the memory device includes fabricating a first layer of MRAM memory cells arranged in accordance with an MRAM architecture, fabricating a second layer of MRAM memory cells over the first layer of MRAM memory cells, and fabricating a common connection associated with the first layer of MRAM memory cells and the second layer of MRAM memory cells that facilitates operation of the memory device.

21 Claims, 6 Drawing Sheets

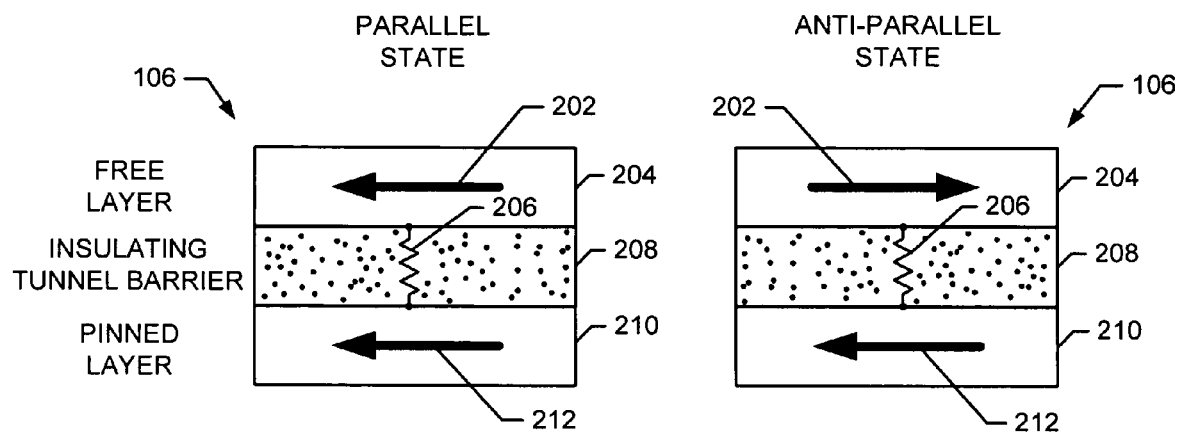
FIG. 2A    FIG. 2B
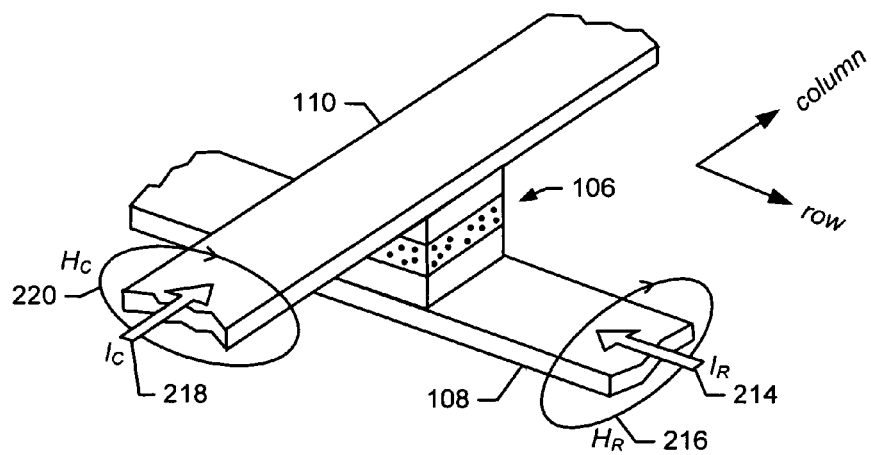
FIG. 2C

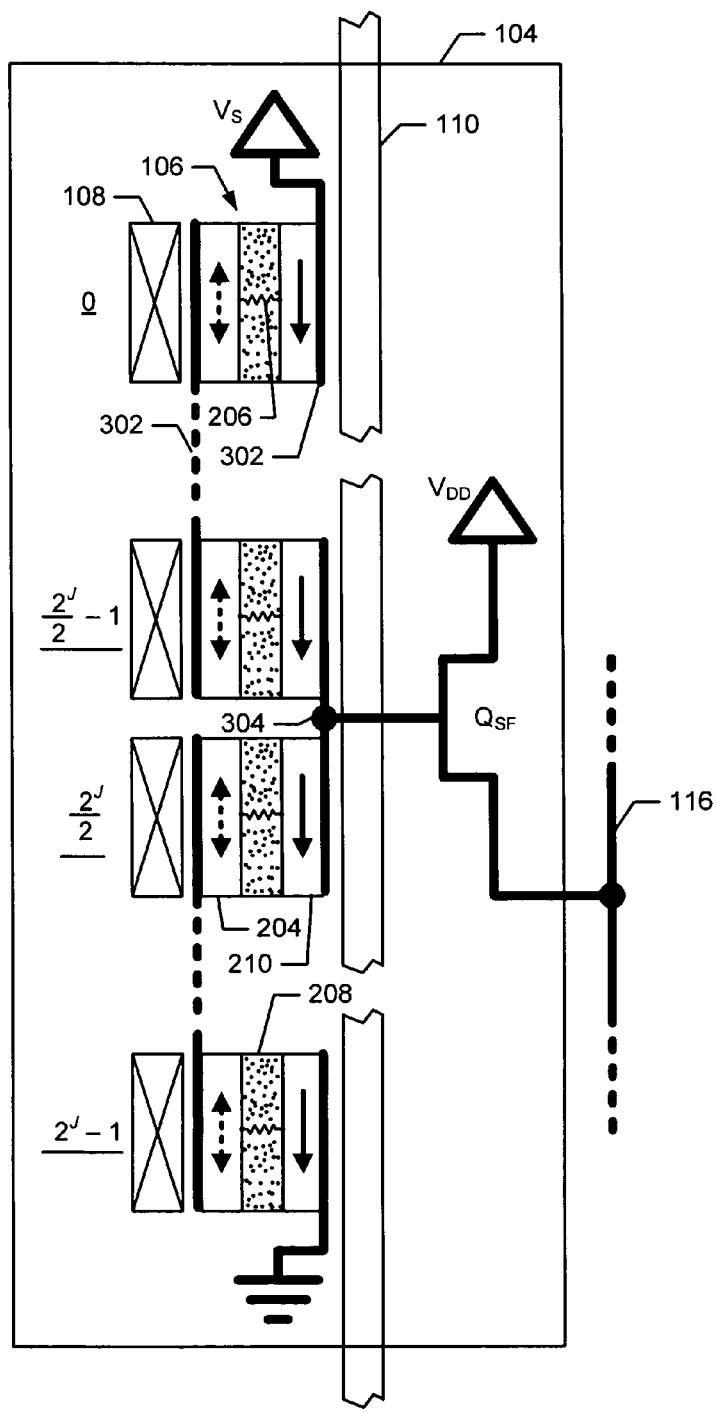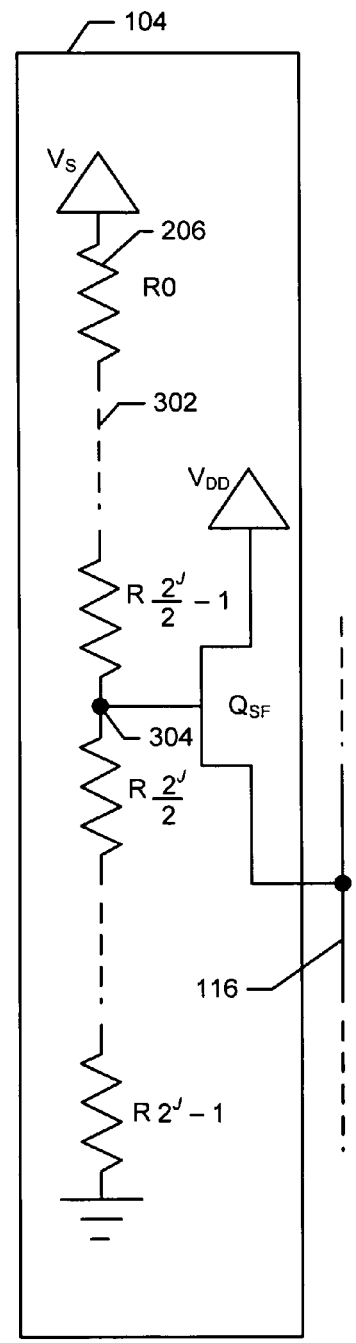
FIG. 3A　　　　FIG. 3B

METHOD AND APPARATUS FOR MULTI-PLANE MRAM

BACKGROUND

The present invention relates to magnetic random access memories (MRAMs). Electronic appliances such as personal computers use electronic memory for data and program storage. Information is represented as bit patterns in the memory. Each bit can have two states, often referred to as a logical 0 and a logical 1 or just simply as 0 and 1.

Electronic memory often takes the physical form of a small silicon die contained within a plastic or ceramic package for physical protection. The silicon die contains the electronic circuitry of the memory and is a small piece of a larger silicon wafer, which allows a large number of memory "chips" to be manufactured together. Desirable characteristics for computer memory chips are random access, low cost, low power, high density, high speed, and writability. Often one characteristic is obtained at the expense of another. For example, extremely high-speed memory might not be low-cost, high-density, or low-power. Two types of electronic memory are frequently used in personal computers. One is dynamic random access memory (DRAM) and the other is static random access memory (SRAM).

DRAM has the characteristics of random access, low cost, moderate power, high density, moderate speed, and writability. The high density and low cost of DRAM are achieved by using tiny capacitors to store electrical charges representing the states of the bits in the memory. Unfortunately, this technique requires complex control circuitry to continually refresh the stored charges on the capacitors. If the charges are not refreshed, they leak away and the data they represent are lost. Continual refreshing of the stored charges results in increased power dissipation even when the memory is not being used, which is problematic for portable computing devices like laptop computers.

SRAM on the other hand, uses latching circuitry to store the states of the bits in the memory. Latching circuitry eliminates the need for complex refresh circuitry and allows SRAM to have very high speed. Unfortunately, the high speed is obtained at the expense of high density due to the increased amount of chip area required by the latching circuitry to store each bit. The lower density also leads to higher cost for SRAM. The extra circuitry used to store each bit also dissipates a large amount of power.

Another shortcoming of DRAM and SRAM is that they are both volatile memory technologies and so lose their stored data when power is removed. Volatile memory is problematic for portable electronic devices like laptop computers. To overcome the problem of volatility, a laptop computer writes the state of its memory to a magnetic storage disk before turning off the power. When the power is turned back on, the operating system and the programs that were previously in use must be restored to the electronic memory. This "boot up" delay is frustrating to many users and could be essentially eliminated if the electronic memory were non-volatile.

Flash memory mitigates the volatility problem for some portable electronic devices like cell phones and digital cameras. Flash memory is a type of EEPROM (electrically erasable programmable read only memory) where a bit of information is stored as a charge on an electrically isolated gate of a field effect transistor. The electrical isolation of the gate prevents the charge from leaking away and effectively makes the memory non-volatile. However, there are characteristics of flash memory that are problematic for its use as the memory of a personal computer. The first characteristic is that the memory has a limited number write/erase cycles. Secondly, to erase bits, a large section of memory is erased in a "flash," which leads to its name.

MRAM is a non-volatile memory technology that relies on the relative magnetic orientations of two magnetic layers sandwiched on either side of a magnetoresistive layer to store data. When the magnetic orientations are parallel, the magnetoresistive layer has a low resistance and when they opposite (often termed anti-parallel), the magnetoresistive layer has a higher resistance. Circuitry on the chip can sense the resistance of a single bit cell and interpret the high or low resistance as either a binary 1 or 0. Since power is not required to maintain the magnetizations, data are retained in the bit cells when power is removed. This yields the non-volatile characteristic of MRAM technology as well reducing its power consumption.

MRAM technology also has other desirable characteristics. It has potential for high density due to the simplicity of the bit cell. Unlike DRAM, which also has a simple bit cell, MRAM does not require complex refresh circuitry. This leads to simpler memory system design and lower system cost. MRAM is also inherently high-speed due to the simplicity of the bit cell.

As previously described, the state of an MRAM memory cell is read by sensing its resistance. High-density memory chips necessitate small feature sizes. These feature sizes include the area of the memory cell and the thickness of its magnetoresistive layer as well as the width and thickness of the lines reading data from the cells. Unfortunately, extremely small feature sizes engender a higher sensitivity to manufacturing variation. This manufacturing variation causes variation in the resistance of different memory cells on the same chip. Furthermore, extremely thin lines have high resistance that leads to significant resistance variations between lines of different lengths. These characteristics are problematic to accurately sensing the resistance of an individual memory cell where the absolute resistance change of the cell between the logical 1 state and the logical 0 state is small compared to resistance variation due to the aforementioned manufacturing variation and line length variation.

Accordingly, there is a need for high-density MRAM that is not sensitive to manufacturing variations that are commonly associated with the small feature sizes of high-density memory chips.

BRIEF DESCRIPTION OF THE DRAWINGS

The present invention is illustrated by way of example and not limitation in the figures of the accompanying drawings in which:

FIG. 2A is a diagram of a magnetoresistive memory cell in a parallel state in accordance with one implementation of the present invention;

FIG. 2B is a diagram of a magnetoresistive memory cell in an anti-parallel state in accordance with one implementation of the present invention;

FIG. 2C is a diagram of a write operation to a magnetoresistive memory cell in accordance with one implementation of the present invention;

FIG. 3A is a diagram of a memory cell string in accordance with one implementation of the present invention;

FIG. 3B is a schematic diagram of a memory cell string in accordance with one implementation of the present invention;

Like reference numbers and designations in the various drawings indicate like elements.

SUMMARY OF THE INVENTION

One aspect of the present invention features a memory device, having a read function, that includes a first layer of MRAM memory cells arranged in accordance with an MRAM architecture, a second layer of MRAM memory cells that is fabricated over the first layer of MRAM memory cells, and a common connection associated with the first layer of MRAM memory cells and the second layer of MRAM memory cells that facilitates operation of the memory device.

Another aspect of the present invention features a method of fabricating the memory device that includes fabricating a first layer of MRAM memory cells arranged in accordance with an MRAM architecture, fabricating a second layer of MRAM memory cells over the first layer of MRAM memory cells, and fabricating a common connection associated with the first layer of MRAM memory cells and the second layer of MRAM memory cells that facilitates operation of the memory device.

DETAILED DESCRIPTION

Implementations of the present invention concern achieving high-density MRAM by having multiple layers of MRAM-memory cells. Adding multiple layers of MRAM cells increases the memory capacity without increasing the area of the memory chip.

Aspects of the present invention are advantageous in at least one or more of the following ways. Adding multiple layers of MRAM memory cells increases the memory storage density of an MRAM chip without decreasing the feature size of the chip. For example, adding an additional layer of MRAM memory cells to a single-layer chip doubles the memory capacity. The memory density of the MRAM chip is effectively doubled without increasing the chip area or shrinking the feature size. One measure of memory density is bits of storage per square millimeter (bits/mm$^2$). Even though adding extra layers of memory cells is a three-dimensional process, the layers are so thin that the apparent size of a multi-layer MRAM chip does not increase and bits/mm$^2$ remains a valid metric for measuring the memory density.

A further advantage of the present invention is its relative insensitivity to manufacturing variation associated with high-density chips with extremely small feature sizes. For example, one form of MRAM design employs magnetoresistive memory cells configured as a resistive voltage divider. One node on the voltage divider is coupled to a bit sense line leading to a sense amplifier. A state change of a single cell results in a relatively small voltage change at the output of the voltage divider that is smaller than the absolute variation of voltages from different voltage dividers. Larger feature sizes reduce the absolute variation among memory cells, which yields an MRAM chip less sensitive to manufacturing variation.

Figure 1:
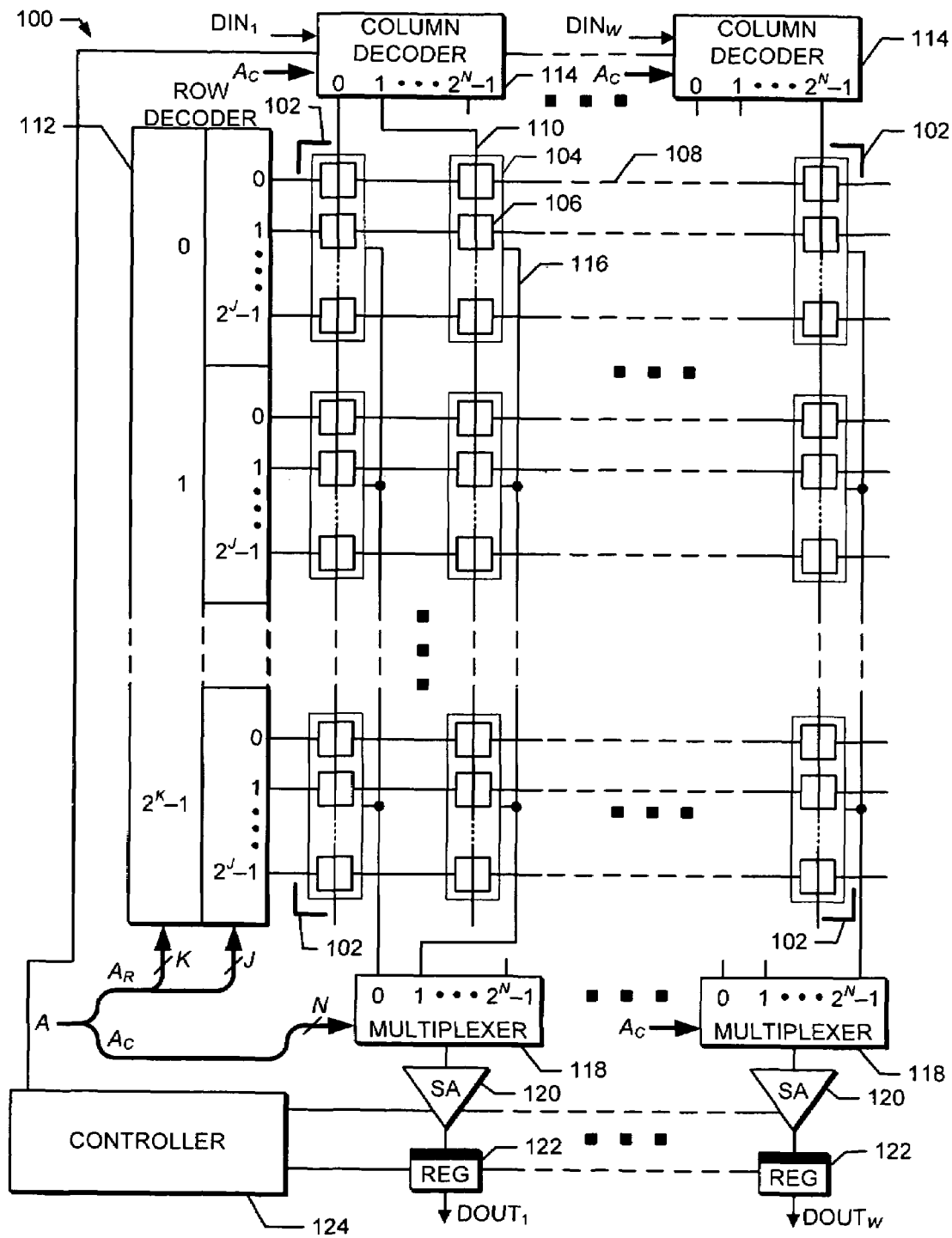
FIG. 1 is a diagram of an exemplary MRAM memory system in accordance with one implementation of the present invention.

Turning first to FIG. 1, an exemplary MRAM memory system 100 designed in accordance with one implementation of the present invention is illustrated. Memory system 100 includes an array 102, (delineated by angle brackets) of memory cell strings 104. Each memory cell string 104 includes two or more memory cells 106. A horizontal word line 108 and a vertical bit line 110 cross each memory cell 106. A row decoder 112 drives word lines 108 and column decoders 114 drive bit lines 110. Each memory cell string 104 has a voltage divider output connected to a bit sense line 116. A single bit-sense line 116 is selected by a multiplexer 118 and connected to the input of a sense amplifier 120. The output of sense amplifier 120 is connected to the input of an output data register 122. A controller 124 is connected to and operates column decoders 114, multiplexers 118, sense amplifiers 120, and data output registers 122. In the illustrated example, memory system 100 uses binary address decoding and illustrates the data storage aspect of the present invention. Alternate implementations of the present invention could also include additional memory cells for redundancy or error correction.

Memory system 100 has a word width of W bits, numbered 1 to W, and a memory address input A. Memory address A is divided into row and column address components $A_R$ and $A_C$ respectively. $A_C$ is N bits wide and $A_R$ is K+J bits wide. Accordingly, memory system 100 has a capacity of $2^{(N+J+K)}$ W-bit words. It follows that each memory cell string 104 has $2^J$ memory cells 106 and there are $2^K$ rows of memory cell strings 104 in array 102.

Array 102 is divided into W bit-groups. Each bit group includes $2^N$ columns of memory cell strings 104. There are W column decoders 114 (one for each bit group), each with $2^N$ vertical bit lines 110. Each column decoder 114 is controlled by its associated data input bit DIN and address component $A_C$. There are W data input lines $DIN_{1-W}$.

There are also W multiplexers 118, each selecting one of $2^N$ bit sense lines 116 from a bit group under the control of address component $A_C$. Each multiplexer 118 drives associated sense amplifier 120, which in turn drives associated single-bit output data register 122. Each output data register has an output DOUT. There are W data output lines $DOUT_{1-W}$ when taken together form the word of width W.

Writing data $DIN_{1-W}$ to address A involves decoding the $A_R$ component of A with row decoder 112 to activate a word line 108. Each of column decoders 114 decodes the $A_C$ component of address A. The DIN bit connected to each column decoder 114 controls the direction of current flow in decoded bit line 110. When an active word line 108 and an active bit line 110 cross a memory cell 106, the memory cell magnetization direction changes according to the direction of current flow in bit line 110 and a bit is written. The direction of the magnetization of memory cell 106 affects its resistance and the resistance of an individual memory cell 106 affects the voltage output from its associated memory cell string 104. The voltage output from the memory cell string represents the content of the data written.

Reading data stored at address A involves a different sequence of steps. First, row decoder 112 decodes the K-bit portion of the $A_R$ component of A to select a row of memory cell strings 104. Selecting a row causes the voltage divider output of memory cell string 104 to be placed on bit sense line 116. Multiplexer 118 selects a bit sense line 116 according to the $A_C$ component of memory address A. A first voltage on bit sense line 116 is routed through multiplexer 118 to sense amplifier 120. Controller 124 causes sense amplifier 120 to store the first voltage for later reference.

Next, controller 124 writes a known state, i.e., either a logical 1 or 0, into memory cells 106 at address A. Then, as previously described, a second voltage is read from the selected row and routed through multiplexer 118 to sense amplifier 120 where controller 124 then causes sense amplifier 120 to compare the second voltage with the stored first voltage. In one implementation of the present invention, the output of sense amplifier 120 indicates with a logical 1 that the stored first voltage is different from the second voltage resulting from writing a known state to memory cell 106. For example, if the known logical state written to memory cell 106 is a logical 0, then the output of sense amplifier 120 will contain a logical 1 if the stored first voltage is different from the second voltage or a logical 0 if the stored first voltage and second voltage are essentially the same. Put alternatively, the output of sense amplifier 120 contains the data that was in memory cell 106 before it was written with the known logical state. Controller 124 then causes the output of sense amplifier to be latched and transferred to output register 122 where it is held until the next read operation.

FIG. 2A is a diagram of a magnetoresistive memory cell 106 in a parallel state in accordance with one implementation of the present invention. Memory cell 106 includes an insulating tunnel barrier 208 sandwiched between a pinned magnetic layer 210 and a free magnetic layer 204. Alternatively, the pinned layer may be substituted instead with what is referred to as a reference layer. In an alternate implementation of the present invention, an MRAM structure uses a soft reference layer rather than pinned magnetic layer 210. The alignment of the magnetization of the soft reference layer is established when a current is applied to either the selected row or selected column. The magnitude of the applied current is large enough to establish a reference magnetization in the soft reference layer but small enough to not disturb data in the free layers. The advantage of using the soft reference layer is the data may be sensed without writing or toggling the free layer as part of a multi-sample read. Implementations of the present invention work well with either a pinned or soft reference layer.

Insulating tunnel barrier 208 has a resistance 206 that is a function of the relative magnetization orientations of pinned magnetic layer 210 and free magnetic layer 204. Pinned magnetic layer 210 is termed "pinned" because its magnetization 212 is oriented in a plane and fixed so as to not rotate in the presence of an applied magnetic field below a predetermined level. Free magnetic layer 204 is termed "free" because its magnetization 202 can be readily oriented in one of two directions along a preferred magnetic axis often termed the "easy" axis. Since free magnetic layer 204 and pinned magnetic layer 210 have the same magnetic orientations, cell 106 is termed to be in the "parallel" state.

FIG. 2B is a diagram of a magnetoresistive memory cell 106 in an anti-parallel state in accordance with one implementation of the present invention. The state of memory cell 106 is termed "anti-parallel" because the magnetic orientation 202 of free magnetic layer 204 is different from the magnetic orientation 212 of pinned magnetic layer 210.

Insulating tunnel barrier 208 separates free magnetic layer 204 and pinned magnetic layer 210. Because insulating tunnel barrier 208 is extremely thin, quantum mechanical tunneling occurs occur between free magnetic layer 204 and pinned magnetic layer 210. This tunneling phenomenon results in an apparent resistance 206 between free magnetic layer 204 and pinned magnetic layer 210. Further, the tunneling phenomenon is electron spin dependent so resistance 206 of insulating tunnel barrier 208 is a function of the relative magnetic orientations of free magnetic layer 204 and pinned magnetic layer 210. In general, the anti-parallel state has a higher resistance 206 than the parallel state.

A single bit of information is stored in memory cell 106 by causing the relative orientation of free magnetic layer 204 to be either parallel or anti-parallel. For example, parallel could indicate the storage of a logical 1 and anti-parallel could indicate the storage of a logical 0, or vice versa. Memory cell 106 is non-volatile because its free magnetic layer 204 and pinned magnetic layer 210 retain their relative magnetic orientation when power is removed.

FIG. 2C is a diagram of a write operation to a magnetoresistive memory cell 106 in accordance with one implementation of the present invention. Memory cell 106 is crossed at substantially right angles by word line 108 and bit line 110. Orienting the free magnetic layer of memory cell 106 to either the parallel or anti-parallel state effects a write operation. The magnetization of the free magnetic layer of selected memory cell 106 is oriented by applying a current $I_R$ 214 to a word line 108 and a current $I_C$ 218 to a bit line 110 that are both coincident with memory cell 106.

A magnetic field $H_R$ 216 is associated with the current $I_R$ 214 flowing in word line 108. Similarly, a magnetic field $H_C$ 220 is associated with the current $I_C$ 218 flowing in bit line 110. When current $I_R$ and current $I_C$ are of a predetermined magnitude, the combination of their respective magnetic fields $H_R$ and $H_C$ will cause the magnetic orientation of free magnetic layer to rotate from parallel to anti-parallel or vice versa. The current magnitudes are selected so that their combined magnetic field is able to rotate the magnetic orientation of the free magnetic layer in selected memory cell 106 without disturbing the corresponding magnetic orientation of the pinned magnetic layer. The direction of current $I_C$ in bit line 110 determines the direction of the magnetic orientation of the free magnetic layer.

FIG. 3A is a diagram of a memory cell string 104 in accordance with one implementation of the present invention. Memory cell string 104 includes $2^J$ memory cells 106 connected in series by metallization links 302 to form a voltage divider between switched voltage source $V_S$ and ground. Memory cells 106 are numbered 0 to $2^J-1$. The middle-two cells are numbered $2^J/2-1$ and $2^J/2$ respectively. For example, if J is equal to 3 then there are $2^3$ or 8 memory cells 106 per memory cell string 104 with the cells numbered from 0 to 7 and the middle-two cells numbered 3 and 4 respectively. Each memory cell 106 is crossed at right angles by a vertical bit line 110 and a horizontal word line 108. Junction 304, located at the midpoint of the series of memory cells 106, is connected to the gate of transistor $Q_{SF}$ and configured as a source follower. The drain of transistor $Q_{SF}$ is connected to voltage source $V_{DD}$ while the source of transistor $Q_{SF}$ is connected to bit sense line 116.

As previously described, memory cell 106 includes insulating tunneling barrier 208 sandwiched between pinned magnetic layer 210 and free magnetic layer 204. The resistance 206 of insulating tunneling barrier 208 is a function of the orientation of the magnetization of free magnetic layer 204. Electrically, memory cell 106 can be modeled as a resistor with resistance 206 in which pinned magnetic layer 210 and free magnetic layer 204 each forms a terminal of the resistor. The voltage divider is formed by connecting pinned magnetic layer 210 of a first memory cell, numbered 0, to switched voltage source $V_S$ and connecting free magnetic layer 204 of the first cell to free magnetic layer 204 of a second, adjacent cell. Pinned magnetic layer 210 of the second cell is connected to pinned magnetic layer 210 of a third cell, adjacent to the second cell. The connection pattern is repeated until a final cell is reached, whereupon pinned magnetic layer 210 of the final cell is connected to ground.

FIG. 3B is a schematic diagram illustrating memory cell string 104 in accordance with one implementation of the present invention. As previously described, memory cell string 104 is effectively a string of resistors, labeled R0 to $R2^J-1$, that form a voltage divider between switched voltage source $V_S$ and ground. Each resistor has a resistance 206 that is a function of the magnetic orientation of the free magnetic layer of its associated memory cell. The voltage divider output is taken from its midpoint 304 operatively connected to the gate of transistor $Q_{SF}$, configured as a source follower. The drain of transistor $Q_{SF}$ is connected to $V_{DD}$ and the source is connected to bit sense line 116. A source follower configured transistor provides extra drive capability necessary for driving bit sense line 116 and also provides isolation of the resistor string from resistor strings of other memory cell strings 104 also connected to bit sense line 116.

When any of memory cells 106 associated with memory cell string 104 are read, switched voltage source Vs is turned on, otherwise, it is at ground potential and switched voltage source Vs is off. As previously described, the magnetic orientation of the free magnetic layer associated with each memory cell is a function of the bit stored in the cell. For example, a binary 1 causes the orientation to point in one direction along the free magnetic layer's easy axis and a binary 0 causes the orientation to point in the opposite direction. There is a different resistance 206 for each orientation. Changing a cell's state changes its resistance, which is reflected as a voltage change at voltage divider midpoint 304 and conveyed by source-follower transistor $Q_{SF}$ to bit sense line 116.

Figure 4A:
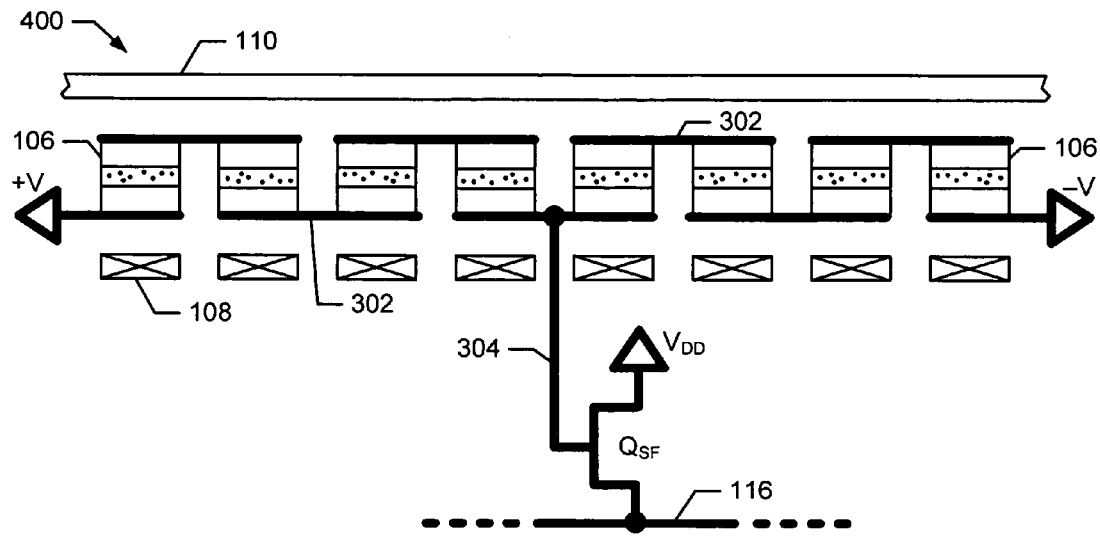
FIG. 4A is a diagram of a single-layer memory cell string in accordance with one implementation of the present invention.

FIG. 4A is a diagram 400 of a single-layer memory cell string in accordance with one implementation of the present invention. Memory cells 106 are arranged according to a BaSS memory cell string architecture. BaSS is an acronym for balanced series string. The series string is termed balanced because there are an equal number of memory cells 106 on either side of a voltage divider center tap 304. Memory cells 106 are connected in series as a voltage divider between +V and −V by means of conductive elements 302. Voltage divider center tap 304 is connected to the gate of transistor $Q_{SF}$. Transistor $Q_{SF}$ forms a source follower with its drain connected to $V_{DD}$ and its source connected to a bit-sense line 116. Each memory cell 106 is located between a bit line 110 and a word line 108 oriented at a right angle to bit line 110.

As previously described, the magnetic orientation of memory cell 106 is set to either parallel or anti-parallel according to currents flowing in its intersecting bit line 110 and word line 108. The magnetic orientation of memory cell 106 affects its resistance, which in turn, affects the voltage at voltage divider center tap 304. Relative voltage changes at voltage divider center tap 304 are conveyed to bit sense line 116 by source-follower transistor $Q_{SF}$.

Figure 4B:
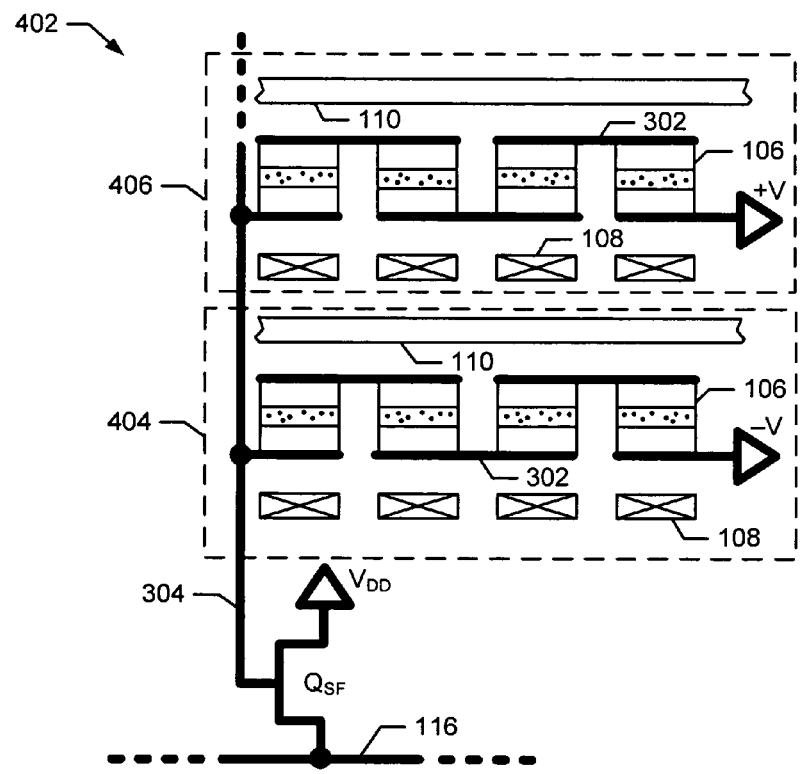
FIG. 4B is a diagram of a memory device having a read function and including a two-layer memory cell string in accordance with one implementation of the present invention.

FIG. 4B is a diagram 402 of a memory device having a read function and including a two-layer memory cell string in accordance with one implementation of the present invention. A first layer of MRAM memory cells 404 is arranged in accordance with an MRAM architecture compatible with a BaSS memory cell string architecture. A second layer of MRAM memory cells 406 is fabricated over the first layer of MRAM memory cells and arranged in accordance with an MRAM architecture compatible with a BaSS memory cell string architecture. A common connection associated with the first layer of MRAM memory cells and the second layer of MRAM memory cells is formed by voltage divider center tap 304. Voltage divider center tap 304 facilitates the operation of the memory device including the read function. Relative voltage changes at voltage divider center tap 304 are conveyed to bit sense line 116 by source-follower transistor $Q_{SF}$.

First layer of MRAM memory cells 404 includes magnetoresistive memory cells 106 connected in series between −V and voltage divider center tap 304 using conductive elements 302. Each memory cell 106 is located between a bit line 110 and a word line 108 oriented at a right angle to bit line 110.

Second layer of MRAM memory cells 406 includes magnetoresistive memory cells 106 connected in series between +V and voltage divider center tap 304 using conductive elements 302. Similar to first layer 404, each memory cell 106 is located between a bit line 110 and a word line 108 oriented at a right angle to bit line 110.

The first and second layers of MRAM memory cells 404, 406 form a BaSS memory cell string wherein the first layer of MRAM memory cells includes memory cells located to a first side of a center tap of a BaSS memory cell string and the second layer of MRAM memory cells includes memory cells located to a second side of the center tap of the BaSS memory cell string. In one implementation of the present invention, a voltage divider center tap 304 of a BaSS memory cell architecture forms a common connection that penetrates the first and second layers of MRAM memory cells 404, 406. As previously described, relative voltage changes at voltage divider center tap 304 are conveyed to bit sense line 116 by source-follower transistor $Q_{SF}$.

Figure 4C:
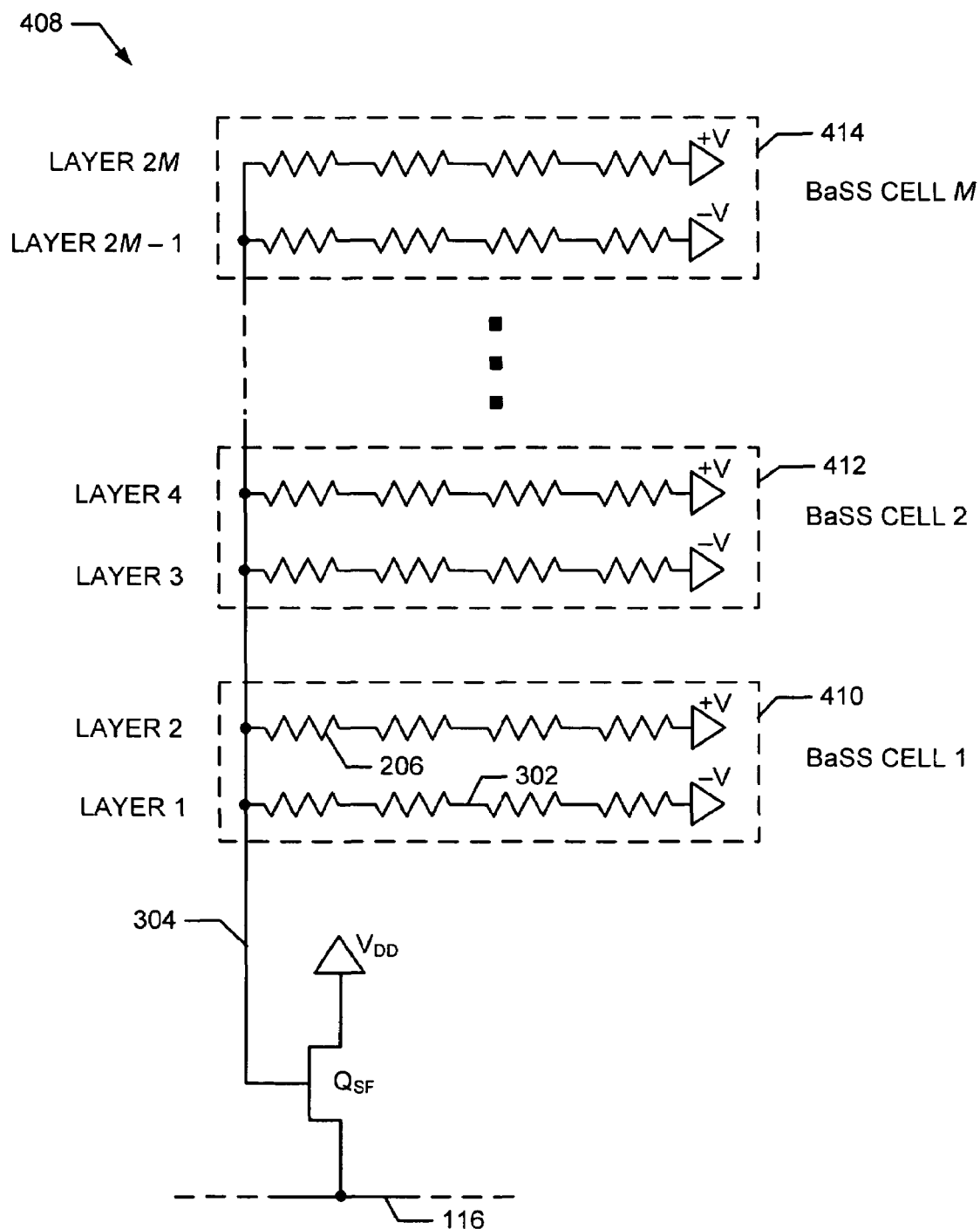
FIG. 4C is a schematic diagram of vertically stacked BaSS memory cell strings in accordance with one implementation of the present invention.

FIG. 4C is a schematic diagram 408 of vertically stacked BaSS memory cell strings in accordance with one implementation of the present invention. A first BaSS memory cell string 410 forms a first and second layer of a memory device. A second BaSS memory cell string 412, stacked upon first BaSS memory cell string 410, forms a third and fourth layer of the memory device. The stacking continues through an Mth BaSS memory cell string 414, which forms memory device layers 2M-1 and 2M. A common connection of BaSS memory cell string voltage divider center taps 304 is coupled to the gate of source-follower transistor $Q_{SF}$, whose drain is connected to $V_{DD}$ and whose source is connected to bit-sense line 116.

Electrically, a BaSS memory cell string is a serial connection of magnetoresistive memory cell resistances 206 using conductive elements 302 to form a voltage divider between +V and −V. Selecting a magnetoresistive memory cell for reading turns on its associated +V and −V voltage sources. Otherwise, +V and −V are placed at ground potential. The state of a magnetoresistive memory cell depends upon the logical state of the bit stored therein. The magnetoresistive memory cell state can either be parallel or anti-parallel, reflecting variously either a logical 1 or logical 0 for its stored bit. Changes between the parallel and anti-parallel states result changes in magnetoresistive memory cell's resistance 206. Because of the voltage divider network, a variation of any resistance 206 results in a voltage variation at voltage divider center tap 304. The voltage variation is conveyed to bit-sense line 116 by source-follower transistor $Q_{SF}$.

Two-layer BaSS memory cell string 410 results in an approximate doubling of memory density when compared to a one-layer BaSS memory cell string organization. Stacking a second two-layer BaSS memory cell string 412 upon BaSS memory cell string 410 results in an approximate four-times increase in memory density. In general, stacking M two-layer BaSS memory cell strings results in an approximate 2M increase in memory density.

Figure 5:
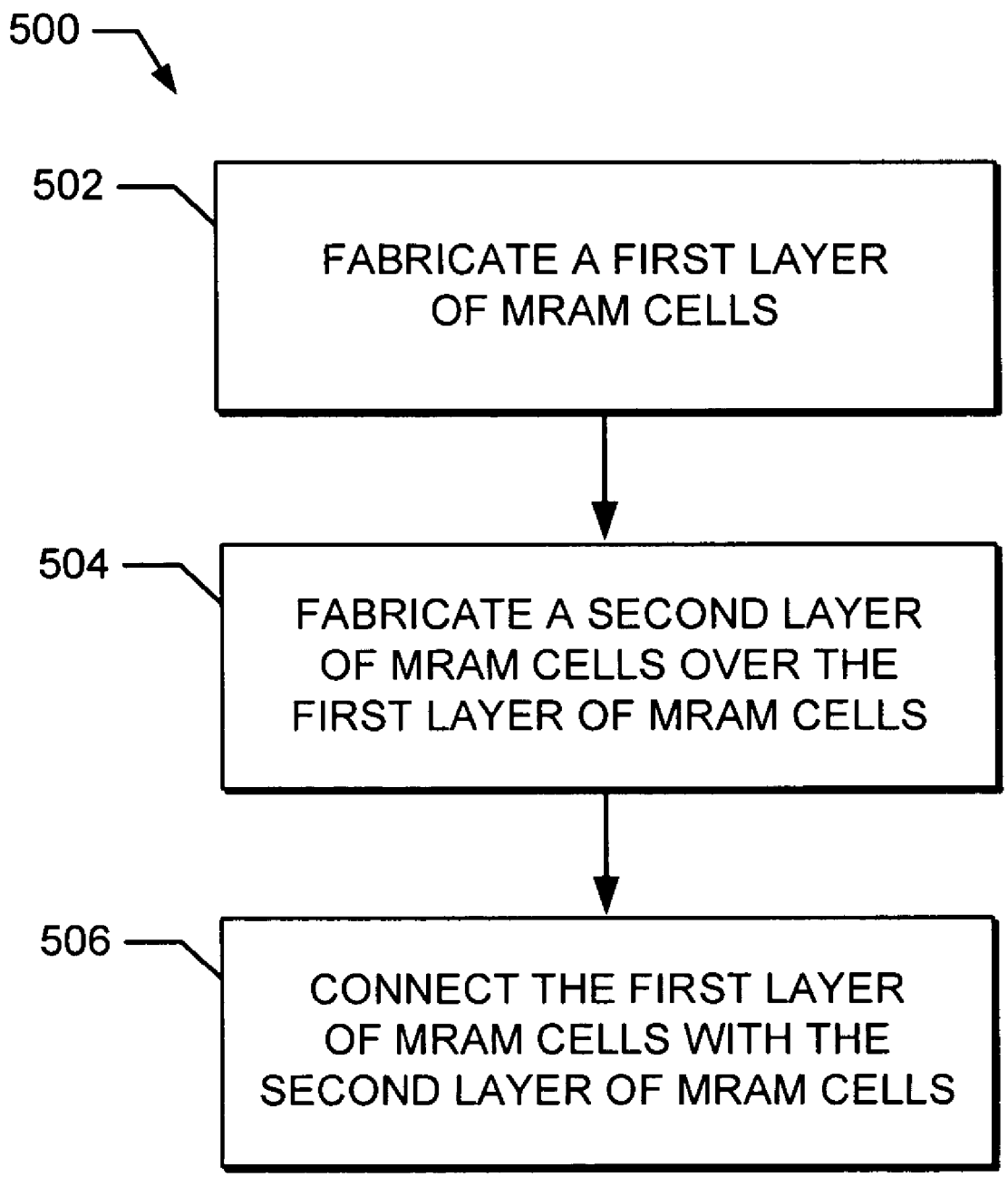
FIG. 5 is a flowchart diagram of the operations pertaining to fabricating an MRAM memory device in accordance with one implementation of the present invention.

FIG. 5 is a flowchart diagram 500 of the operations pertaining to fabricating an MRAM memory device in accordance with one implementation of the present invention. The fabrication operation begins by fabricating a first layer of MRAM cells (502). In one implementation employing a BaSS memory cell string architecture, the first layer includes individual magnetoresistive memory cells, bit lines and word lines, conductive elements, and switched voltage sources. Individual magnetoresistive memory cells are sandwiched between a bit line and word line oriented at right angles. Groups of magnetoresistive memory cells are connected in series strings using conductive elements. One end of each series string is connected to a switched voltage source and the other end is connected to a voltage divider center tap operatively coupled to a source-follower transistor.

The next operation involves fabricating a second layer of MRAM over the first layer of MRAM cells (504). Again, in one implementation employing a BaSS memory cell string architecture, the second layer includes individual magnetoresistive memory cells, bit lines and word lines, conductive elements, and switched voltage sources. Individual magnetoresistive memory cells are sandwiched between a bit line and word line oriented at right angles. Groups of magnetoresistive memory cells are connected in series strings using conductive elements. One end of each series string is connected to a switched voltage source that is opposite polarity of its associated switched voltage source in the first layer and the other end is connected to a voltage divider center tap.

The next operation involves connecting the first layer of MRAM memory cells with the second layer of MRAM memory cells (506). Again, in one implementation employing a BaSS memory cell string architecture, associated voltage divider center taps of the first and second layers are connected. Connecting associated voltage divider center taps results in a folded BaSS memory cell structure. The structure is termed "folded" because the first layer contains the memory cells to one side of the voltage divider center tap and the second layer contains the memory cells to the other side of the voltage divider center tap.

While specific embodiments have been described herein for the purposes of illustration, various modifications may be made without departing from the spirit and scope of the invention. Accordingly, the invention is not limited to the above-described implementations, but instead is defined by the appended claims in light of their full scope of equivalents.

What is claimed is:

1. A memory device, comprising:
   a first layer of MRAM memory cells arranged in accordance with an MRAM architecture;
   a second layer of MRAM memory cells that is fabricated over the first layer of MRAM memory cells; and
   a common connection associated with the first layer of MRAM memory cells and the second layer of MRAM memory cells in the form of a voltage divider tap that facilitates operation of the memory device, the memory cells of the first layer independently operable from the memory cells of the second layer.

2. The memory device of claim 1 wherein the memory cell is a magnetoresistive memory cell.

3. The memory device of claim 1 wherein the MRAM architecture is compatible with a BaSS memory cell string architecture.

4. The memory device of claim 1 wherein the first layer of MRAM memory cells includes memory cells located to a first side of a voltage divider center tap of a BaSS memory cell string and the second layer of MRAM memory cells includes memory cells located to a second side of the voltage divider center tap of the BaSS memory cell string.

5. The memory device of claim 1 wherein the common connection penetrates the first layer of MRAM memory cells and the second layer of MRAM memory cells.

6. The memory device of claim 1 wherein the common connection facilitates operation of the memory device read function.

7. The memory device of claim 1 wherein the common connection is a voltage divider center tap of a BaSS memory cell architecture.

8. The memory device of claim 1, wherein the voltage divider tap is connected to a gate input of a source follower transistor.

9. The memory device of claim 8, wherein the source follower transistor is structured and arranged as an isolation device and an analog amplifier.

10. A memory device, comprising:
    a first layer of MRAM memory cells arranged in accordance with an MRAM architecture compatible with a BaSS memory cell string architecture;
    a second layer of MRAM memory cells that is fabricated over the first layer of MRAM memory cells and arranged in accordance with an MRAM architecture compatible with a BaSS memory cell string architecture; and
    a common connection associated with the first layer of MRAM memory cells and the second layer of MRAM memory cells that facilitates operation of the memory device.

11. The memory device of claim 10 wherein the first layer of MRAM memory cells includes memory cells located to a first side of a voltage divider center tap of a BaSS memory cell string and the second layer of MRAM memory cells includes memory cells located to a second side of the voltage divider center tap of the BaSS memory cell string.

12. The memory device of claim 10 wherein the common connection penetrates the first layer of MRAM memory cells and the second layer of MRAM memory cells.

13. The memory device of claim 10 wherein the common connection facilitates operation of the memory device read function.

14. The memory device of claim 10 wherein the common connection is a voltage divider center tap of a BaSS memory cell architecture.

15. A method of fabricating a memory device, comprising:
    fabricating a first layer of MRAM memory cells arranged in accordance with an MRAM architecture;
    fabricating a second layer of MRAM memory cells over the first layer of MRAM memory cells; and
    fabricating a common connection associated with the first layer of MRAM memory cells and the second layer of MRAM memory cells in the form of a voltage divider tap that facilitates operation of the memory device, the memory cells of the first layer independently operable from the memory cells of the second layer.

16. The method of claim 15 wherein the MRAM architecture is compatible with a BaSS memory cell string architecture.

17. The method of claim 15 wherein the first layer of MRAM memory cells includes memory cells located to a first side of a voltage divider center tap of the BaSS memory cell string and the second layer of MRAM memory cells includes memory cells located to a second side of the voltage divider center tap of the BaSS memory cell string.

18. The method of claim 15 wherein the common connection penetrates the first layer of MRAM memory cells and the second layer of MRAM memory cells.

19. The method of claim 15 wherein the common connection is a voltage divider center tap of the BaSS memory cell architecture.

20. A memory device, comprising:
  a first layer of MRAM memory cells arranged in accordance with an MRAM architecture, the first layer of MRAM cells subdivided into at least one first memory cell string;
  a second layer of MRAM memory cells that is fabricated over the first layer of MRAM memory cells, the first layer of MRAM cells subdivided into at least one second memory cell string, the memory cells within each memory cell string independently operable; and
  a common connection associated with the first layer of MRAM memory cells and the second layer of MRAM memory cells in the form of a voltage divider tap that facilitates operation of the memory device, the voltage divider tap connected to a gate input of a source follower transistor.

21. The memory device of claim 20, wherein the source follower transistor is structured and arranged as an isolation device and an analog amplifier.

* * * * *